United States Patent [19]
Larimer

[11] Patent Number: 5,736,787
[45] Date of Patent: Apr. 7, 1998

[54] TRANSISTOR PACKAGE STRUCTURED TO PROVIDE HEAT DISSIPATION ENABLING USE OF SILICON CARBIDE TRANSISTORS AND OTHER HIGH POWER SEMICONDUCTOR DEVICES

[76] Inventor: William R. Larimer, 1287 William St., Baltimore, Md. 21230

[21] Appl. No.: 682,874

[22] Filed: Jul. 11, 1996

[51] Int. Cl.$^6$ .......................... H01L 23/12; H01L 23/02; H01L 23/52

[52] U.S. Cl. .......... 257/732; 257/712; 257/731; 257/725; 257/728; 257/774; 257/733; 361/714; 361/688

[58] Field of Search ............... 257/732, 733, 257/731, 723, 725, 728, 712, 717, 708, 709, 774; 361/714, 688, 679, 704

[56] References Cited

U.S. PATENT DOCUMENTS

| | | | |
|---|---|---|---|
| 3,377,524 | 4/1968 | Bock et al. | 257/732 |
| 3,586,917 | 6/1971 | Oates | 257/708 |
| 4,213,141 | 7/1980 | Colussi | 257/773 |
| 5,247,192 | 9/1993 | Nii | 257/49 |
| 5,365,108 | 11/1994 | Anderson et al. | 257/708 |
| 5,455,448 | 10/1995 | Benjamin | 257/712 |
| 5,481,436 | 1/1996 | Werther | 257/698 |
| 5,488,252 | 1/1996 | Johansson et al. | 257/579 |
| 5,519,253 | 5/1996 | Lake et al. | 257/733 |

Primary Examiner—Wael Fahmy
Assistant Examiner—Alexander Oscar Williams
Attorney, Agent, or Firm—Walter G. Sutcliff

[57] ABSTRACT

A package for relatively high power transistors including heat conducting mounting flange having a relatively large "footprint" relative to the area covered by at least one active chip supported thereby and comprised of a plurality of bipolar silicon-carbide transistors. The transistors are located on a dielectric substrate brazed to the flange. A plurality of screw mounting holes, preferably eight in number, are included in the mounting flange adjacent the outer edge of the dielectric substrate so as to surround the chip. Mounting screws in the eight mounting holes together with a relatively large flange/ground plane interface significantly improves heat dissipation for the heat generated by the silicon carbide transistors by promoting radial heat spreading through the heat conductive metal flange.

20 Claims, 1 Drawing Sheet

U.S. Patent      Apr. 7, 1998      5,736,787
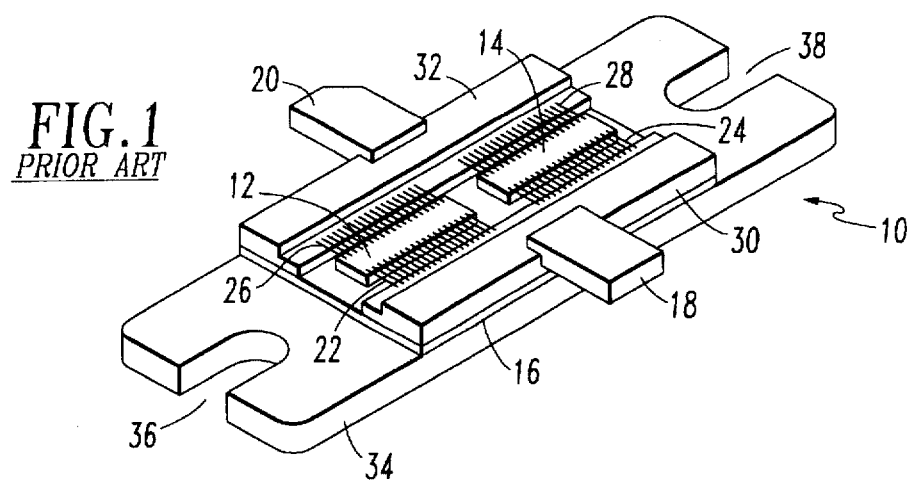
FIG. 1 PRIOR ART
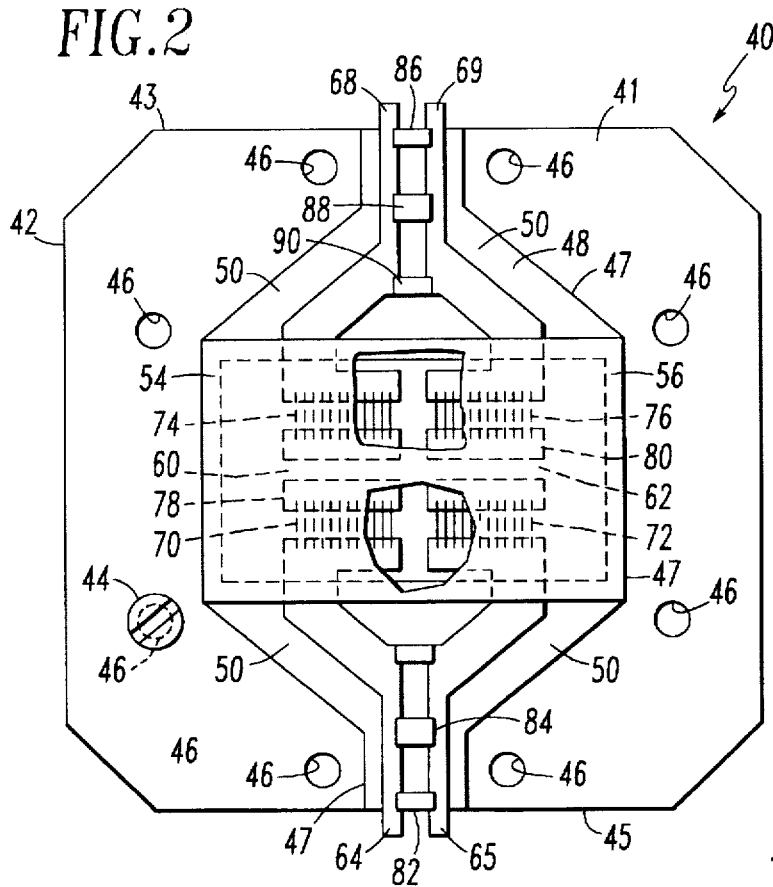
FIG. 2
FIG. 3
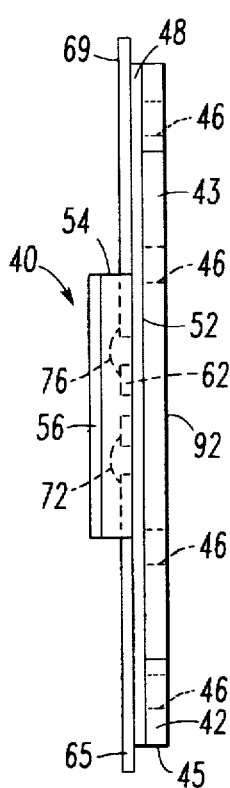
FIG. 4

TRANSISTOR PACKAGE STRUCTURED TO PROVIDE HEAT DISSIPATION ENABLING USE OF SILICON CARBIDE TRANSISTORS AND OTHER HIGH POWER SEMICONDUCTOR DEVICES

BACKGROUND OF THE INVENTION

1. Field of the Invention

This invention relates generally to apparatus for dissipating heat generated by relatively high power semiconductor devices and more particularly to a package for dissipating the heat generated by relatively high power RF transistors.

2. Description of the Prior Art

RF amplifier circuitry currently being designed is becoming increasingly sensitive to the heat dissipation problem encountered by the output power generated and accordingly the heat produced by a new class of semiconductor devices known in the art as silicon-carbide transistors. Such devices can generate 160 watts average heat in a relatively small active area, e.g. 0.025 sq. in., providing a heat density of 20,000 watts per sq. in. Typically, RF devices dissipating over 20 watts are liquid cooled. For most RF transmitter systems, however, there is a distinct advantage to cooling such devices directly with air using a blower rather than a liquid cooling type system. Many systems, like transmitters utilized for broadcasting television, require air cooling as opposed to liquid cooling. For such systems, thermal resistances become extremely critical.

Current semiconductor device packages utilized in such systems, when screw-mounted to a ground plane, are restricted in dissipated power because the interface resistance between the package and the ground plane results in high junction temperatures and accordingly unreliable operation. In most commercial applications, high power transistors are normally soldered to their respective substrates to minimize this thermal interface resistance. This technique, however, has several drawbacks. The power transistor, being one of the highest failure-rate items, requires occasional replacement. The replacement process involves solder reflow and cleaning operations that are costly and often result in poor quality due to difficulty of achieving localized reflow, incomplete coverage and inconsistent thermal and electrical performance, degradation of plating integrity and leaching, and stress failures due to material expansion at extreme temperatures. Such issues have therefore led many manufacturers to consider their RF transistor modules "disposable" upon failure of a transistor.

In typical designs, the size of the transistor package is dictated by circuit matching resulting from capacitance and inductances associated with tracks, pads and bond-wires. The typical package width from input to output leads is on the order of 0.25 in.–0.40 in. This limited package size thus makes it extremely difficult to extract heat effectively.

SUMMARY

Accordingly, it is the primary object of the present invention to provide an improvement in the dissipation of heat from electronic devices.

It is another object of the invention to provide an improvement in the cooling of semiconductor devices.

It is a further object of the invention to provide an improvement in the cooling of RF power transistors.

It is yet another object of the invention to provide an improvement in the cooling of silicon carbide power transistors.

Briefly, the foregoing and other objects are achieved by means of a package for relatively high power transistors including a nickel and gold plated heat conducting mounting flange having a relatively large "footprint" relative to the area covered by at least one active chip supported thereby and comprised of a plurality of bipolar silicon-carbide transistors. The transistors are located on a copper plated ceramic dielectric substrate brazed to the flange. A plurality of screw mounting holes, preferably eight in number, are included in the mounting flange adjacent the outer edge of the dielectric substrate so as to surround the chip. Mounting screws in the eight mounting holes together with a relatively large flange/ground plane interface significantly improves heat dissipation for the heat generated by the silicon carbide transistors by promoting radial heat spreading through the heat conductive metal flange. The transistors are attached to input and output circuitry via bond-wiring. The electrical input and output of the package are formed with pairs of beam leads.

Further scope of applicability of the present invention will become apparent from the detailed description given hereinafter. However, it should be understood that the detailed description and specific example, while indicating the preferred embodiment of the invention, is given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow in the accompanying drawing which is given by way of illustration only and thus is not limitative of the present invention, and wherein:

FIG. 1 is a perspective view generally illustrative of a known prior art high power RF transistor package;

FIG. 2 is a top plan elevational view illustrative of the preferred embodiment of the subject invention;

FIG. 3 is a front elevational view of the preferred embodiment of the invention shown in FIG. 2; and FIG. 4 is a side elevational view of the preferred embodiment of the invention shown in FIG. 2.

DETAILED DESCRIPTION OF THE PREFERRED EMBODIMENT

Referring now to the figures and more particularly to FIG. 1, shown thereat is a typical transistor package 10 in accordance with the known prior art including a pair of active semiconductor chips 12 and 14, each including a plurality of RF bipolar transistors, not shown, mounted on a dielectric substrate 16 and being connected to flat elongated input and output beam leads 18 and 20 by sets of bond-wires 22, 24 and 26, 28 which extend from the chips 12 and 14 outwardly to elongated pads 30 and 32, to which the leads 18 and 20 are connected. All of these components are located on an elongated metal flange 34 plated, for example, with nickel and gold and having slots 36 and 38 formed at the ends for being mounted on a ground plane, not shown, by metallic hardware, e.g. metal screws or bolts.

While such a configuration is acceptable for relatively lower power semiconductor devices formed, for example, in silicon, such is not the case where the devices formed in the active chips 12 and 14 comprise silicon carbide bipolar transistors which are capable of generating 160 watts average heat as opposed to 50 watts for silicon bipolar transistors.

Considering now the preferred embodiment of the invention, reference is now collectively made to FIGS. 2, 3 and 4. There a high power RF transistor package implementation is depicted which incorporates impedance matching circuitry onto an expanded mounting flange 42 capable of handling greater than 150 watts dissipation while maintaining standard mounting procedures such as being secured to a ground plane, not shown, by metal screws, one of which is shown by reference numeral 44 as shown in FIGS. 2 and 3.

The mounting flange 42 includes a flat top surface 41 and comprises a flat generally square shaped member consisting of tungsten and which is plated with nickel and gold and having beveled corners as shown in FIG. 2. The flange 42, moreover, includes eight mounting holes 46, four on each side of and adjacent the outer edge 47 of a dielectric substrate 48. The substrate 48 is comprised of ceramic insulating material such as beryllium oxide and is coated on its upper surface 50 with copper and extends between opposite edges 43 and 45 of the flange 42. The ceramic substrate 48 is brazed to the flange 42 so as to provide a brazed interface 52 therebetween. The flange 42, moreover, is matched for thermal expansion with the ceramic substrate 48. The ceramic substrate 48 includes a circuit pattern, not shown, etched onto the upper surface 50.

A metallized frame member 54 and a lid 56 resides on the ceramic substrate 48. Within the frame 54 on the ceramic substrate 48 is a pair of active semiconductor chips 60 and 62, each including a plurality of mutually parallel silicon carbide bipolar transistors, not shown. This constitutes the active area wherein a large amount of heat typically 160 watts, is generated, by the silicon carbide transistors. This heat must be dissipated to prevent catastrophic failure of the transistors and thus the device 40. The two active chips 60 and 62 are coupled to pairs of input and output beam leads 64, 65, and 68, 69 by pairs of wire-bond elements 70, 72 and 74, 76. As best shown in FIG. 2, the input beam leads 64 and 65 flare out to connect to the wire-bonds 70 and 72, while the output beam leads 68 and 69 flare out in identical fashion to connect to the wire-bonds 74 and 76.

Whereas a portion of the input and output impedance matching means are located externally of the prior art transistor package shown in FIG. 1, in the embodiment of the subject invention shown in FIGS. 2-4, impedance matching elements are located directly on the package 40. As shown in FIG. 2, in addition to impedance matching regions 78 and 80 comprised of printed and descrete elements on either side of the active chips 60 and 62, additional impedance matching elements are included, such as a pair of capacitors 82 and 84 being coupled across the input leads 64 and 66, while three capacitors 86, 88 and 90 are shown coupled across the output leads 68 and 70.

It is to be noted that the flange mounting holes 46 are equally spaced from one another and completely surround the active silicon carbide transistor chips 60 and 62. The mounting holes 46 are thus spaced to allow maximum use of the relatively large contact area on the undersurface 92 of the flange 42 for dissipating heat to the ground plane, not shown, to which it can be attached by respective screws 44. Such a configuration permits radial heat spreading through the metal flange 42 and the resulting heat density at the contact interface 92 with the ground plane is reduced.

Also, it should be noted that the area of the undersurface 92 of the flange 42 is relatively large compared to the area within which heat is generated, i.e., the chips 60 and 62, being in the order of 150:1. Such an arrangement results in a relatively small temperature drop across the interface between the undersurface 92 of the flange 42 and the surface of the ground plane, not shown, to which it is attached, thus reducing the operating temperature of the entire device 40, particularly semiconductor junction temperatures, while conducting the heat generated by the active chips 60 and 62 to the ground plane. This can be demonstrated by the following calculation of contact temperature drop $\Delta T$.

The thermal interface contact resistance $R_c$ can be calculated from data based on the materials, plating and contact pressure. The contact pressure P can be estimated from the empirical relation:

$$P = 5 \cdot n \cdot T / (n \cdot A \cdot d) \tag{1}$$

where n is the number of screws utilized, T is the screw torque, A is the mounting interface area per screw, and d is the nominal screw diameter.

For eight #4–40 Pan Head screws, a screw torque of 6 in.-lb., a nominal screw diameter of 0.112 in. and a mounting interface area per screw of 0.216 sq. in., based on the area being 2.5 times the screwhead diameter and accordingly $(\pi/4) \times (2.5 \times 0.21 \text{ in.})^2$, the contact pressure P is found to be 1237 psi.

The contact resistance $R_c$ can be estimated from charts based on experimental results for tungsten-copper on aluminum. Accordingly, $R_c \approx 0.10°$ C.in$^2$/W.

The average contact temperature drop $\Delta T$ can be expressed as:

$$\Delta T = R_c \cdot P_d / A \tag{2}$$

where $P_d$ is the amount of heat to be dissipated, e.g. 160 W. This results in a contact temperature drop $\Delta T$ of:

$$\Delta T = 0.10 \times 160/(8 \times 0.216) = 9.3° \text{ C}. \tag{3}$$

It should be pointed out that the temperature drop for a package such as shown in FIG. 1 utilizing two screws for securing the device to a ground plane, has approximately four times this temperature drop, i.e. 37° C. Thus the net savings achieved by the embodiment of the subject invention is 28° C. and has a vital impact on both electrical performance and reliability of the device.

Thus what has been shown and described is a new and improved high power transistor package capable of handling 150 or more watts of heat while using standard mounting procedures. Moreover, fewer RF power devices are required to generate the total power level desired, thus reducing parts count and cost and is accomplished without sacrificing unit repairability or the performance of surrounding circuitry.

The invention being thus described, it would be obvious that the same may be varied in many ways. Such variations are not to be regarded as a departure from the spirit and scope of the invention, and all such modifications as would be obvious to one skilled in the art are intended to be included within the scope of the following claims.

I claim:

1. A package for relatively high power heat generating semiconductor devices, comprising:
   - a heat conductive metal flange having a bottom side providing a ground plane contact interface having a heat transfer area for ground plane dissipation of device generated heat;
   - a dielectric substrate having a metallic upper surface; a bottom surface of the said substrate bonded to a top surface of said metal flange;
   - at least one heat generating semiconductor device located on the metallic upper surface of said substrate and generating heat over an active device surface area to be dissipated to said substrate;

input and output circuit means coupled to said semiconductor device; and a set of ground plane mounting holes provided in said metal flange and surrounding said at least one semiconductor device, the number of said mounting holes and the ratio of the flange heat transfer area to the device active area being such that the resulting interface contact pressure caused by ground plane securing elements and the resulting interface temperature drop enable sufficient heat dissipation for the semiconductor devices to be silicon carbide transistors or other semiconductor devices substantially equivalent to such transistors in heat generation.

2. A package in accordance with claim 1 wherein said at least one semiconductor device comprises a semiconductor chip and wherein said ratio is relatively large.

3. A package in accordance with claim 2 wherein said semiconductor chip includes a plurality of semiconductor devices.

4. A package in accordance with claim 3 wherein said semiconductor devices comprise transistors.

5. A package in accordance with claim 4 wherein said transistors comprise bipolar RF power transistors.

6. A package in accordance with claim 5 wherein said transistors comprise silicon carbide transistors.

7. A package in accordance with claim 1 wherein said mounting holes are located adjacent an outer edge of said dielectric substrate.

8. A package in accordance with claim 7 wherein said set of mounting holes comprise a plurality of equally spaced mounting holes for receiving respective metal fasteners thereat for permitting radial heat spreading through said heat conductive metal flange.

9. A package in accordance with claim 8 wherein said plurality of mounting holes comprise at least eight mounting holes.

10. A package in accordance with claim 8 wherein the top surface of said flange is generally square in configuration.

11. A package in accordance with claim 1 wherein said dielectric substrate extends between opposite edges of said flange, said substrate having a relatively narrow width section of a first predetermined length at said edges and flaring out into a relatively larger width section of a second predetermined length of a central region on the top surface of said flange, said semiconductor device being located on said larger width section of said dielectric substrate.

12. A package in accordance with claim 11 wherein said larger width section of said dielectric substrate is rectangular in configuration.

13. A package in accordance with claim 12 wherein said larger width section of said substrate has a width dimension greater than said second predetermined length.

14. A package in accordance with claim 12 wherein said at least one semiconductor device comprises a semiconductor chip including a plurality of transistors.

15. A package in accordance with claim 14 wherein said transistors comprise bipolar RF power transistors.

16. A package in accordance with claim 15 wherein said transistors comprise silicon carbide transistors.

17. A package in accordance with claim 15 and additionally including impedance matching means on said substrate coupled between said semiconductor chip and said input and output circuit means.

18. A package in accordance with claim 17 wherein said input and output circuit means include a first and second set of wire bonds respectively connected to an input lead and an output lead extending to said opposite edges of said flange and over said relatively narrow width section of said dielectric substrate.

19. A package in accordance with claim 18 wherein said at least one semiconductor device comprises a pair of semiconductor chips each including a plurality of bipolar RF power transistors, said impedance matching means comprises respective impedance matching means coupled between said pair of semiconductor chips and input and output circuit means, and said input and output circuit means comprises first and second parallel beam leads having a relatively narrow width at the edges of said flange and flaring out to a relatively wide width at said chips and respective first and second sets of bond-wires coupling said semiconductor chips to said input leads and said output leads.

20. A package in accordance with claim 19 and wherein said impedance matching means includes capacitance means coupled between said first and second parallel beam leads.

* * * * *